United States Patent [19]
Ku et al.

[11] 3,982,967
[45] Sept. 28, 1976

[54] METHOD OF PROTON-ENHANCED DIFFUSION FOR SIMULTANEOUSLY FORMING INTEGRATED CIRCUIT REGIONS OF VARYING DEPTHS

[75] Inventors: San-Mei Ku, Poughkeepsie; Charles A. Pillus, Wappingers Falls; Michael R. Poponiak, Newburgh; Robert O. Schwenker, Hopewell Junction, all of N.Y.

[73] Assignee: IBM Corporation, Armonk, N.Y.

[22] Filed: Mar. 26, 1975

[21] Appl. No.: 562,370

[52] U.S. Cl. .................................. 148/1.5; 357/91
[51] Int. Cl.² ...................................... H01L 21/263
[58] Field of Search ..................... 148/1.5; 357/91

[56] References Cited
UNITED STATES PATENTS

| | | | |
|---|---|---|---|
| 3,515,956 | 6/1970 | Martin et al. ................. | 148/1.5 X |
| 3,533,857 | 10/1970 | Mayer et al. .................. | 148/1.5 |
| 3,655,457 | 4/1972 | Duffy et al. ................... | 148/1.5 |
| 3,718,502 | 2/1973 | Gibbons ........................ | 148/1.5 UX |
| 3,756,862 | 9/1973 | Ahn et al. ..................... | 148/1.5 |
| 3,761,319 | 9/1973 | Shannon ........................ | 148/1.5 |

OTHER PUBLICATIONS

Nelson et al. "Radiation-Enhanced Diffusion of Boron in Silicon," Appl. Phy. Let. vol. 15, No. 8, Oct. 15, 1969, pp. 246-248.
Ziegler, "Improving The Electrical . . . etc." IBM Tech. Discl. Bul. vol. 12, No. 10, March 1970, p. 1576.
Gibbons, "Proton-Enhanced Diffusin In Semiconductors," Abstract No. 48, ECS Meeting, May 1974, San Francisco.
Baruch et al., "Redistribution of Boron . . . etc.," Paper III-8, International Conf. on Ion Impl. in Semiconductors, etc. Osaka, J. 8/74.

*Primary Examiner*—L. Dewayne Rutledge
*Assistant Examiner*—J. M. Davis
*Attorney, Agent, or Firm*—J. B. Kraft

[57] ABSTRACT

In integrated circuit fabrication, a method is provided for simultaneously forming two regions of the same conductivity-type such as the base and isolation regions. In one embodiment, an epitaxial layer of one conductivity-type is formed on a substrate of opposite conductivity-type, after which dopant ions of the opposite conductivity-type are introduced into the epitaxial surface areas which are to provide the base and isolation regions, and in addition, the isolation regions are bombarded with non-dopant ions having a maximum atomic number of two, e.g., hydrogen or helium ion while the base regions are appropriately masked and remain umbombarded, said bombardment is carried out at temperatures below 300° C, preferably room temperature. The bombardment is preferably carried out so that the non-dopant ions are implanted primarily in regions below the isolation regions. Next, the wafer is heated at a temperature at a range of from 600° - 900° C which is substantially below normal drive-in diffusion temperatures for unbombarded doped regions. The heating to be maintained for a period sufficient to drive-in diffuse the bombarded isolation regions through the epitaxial layer into contact with the substrate but is insufficient to drive-in the unbombarded base regions to such a depth.

29 Claims, 5 Drawing Figures

METHOD OF PROTON-ENHANCED DIFFUSION FOR SIMULTANEOUSLY FORMING INTEGRATED CIRCUIT REGIONS OF VARYING DEPTHS

BACKGROUND OF INVENTION

The present invention relates to the fabrication of integrated circuits and, more particularly, to a method proton-enhanced diffusion, e.g., diffusion enhanced by the bombardment of ions having a maximum atomic number of two.

Proton-enhanced diffusion has been used in the art to shift P-N and other junctions in planar integrated circuits. U.S. Pat. Nos. 3,718,502, 3,756,862 and 3,761,319 are representative of such proton-enhanced diffusion techniques in the art. In the conventional proton-enhanced diffusion techniques, the P or N type region to be subjected to enhanced diffusion is bombarded with proton (hydrogen) or helium ions at relatively high temperature in the order of more than 450° C for silicon. In these processes, the elevated temperatures are selected so that the drive-in diffusion step, i.e., the driving in or shifting of the junction of the region being bombarded, takes place simultaneously with the bombardment. Thus, the elevated temperature selected must be sufficiently high so that diffusion of the conductivity-determining or dopant ions from the regions being bombarded can take place. While such temperatures are below the normal diffusion temperatures of the particular dopant ions in the particular semiconductor material without such bombardment, nevertheless, the temperatures must be sufficiently high to cause the movement of the dopant ions into substitutional vacancy sites in the surrounding semiconductor material created by the "damaging" bombardment ions. Because elevated temperatures of this order also simultaneously anneal the "damaged" substitutional vacancies, such simultaneous diffusion and bombardment processes have to be conducted under very strict control conditions involving the parameters of diffusivity of the particular dopant ions in the particular semiconductor substrate, temperature, and bombardment dosage. These parameters must be strictly correlated in order to ensure that there are a sufficient number of substitutional vacancies (a factor determined by a combination of anneal rate and bombardment dosage) to accept the number of diffusing dopant ions (a factor determined by a combination of diffusivity and temperature). In addition, such simultaneous processes require higher dosages and higher implant energies to continuously offset the annealing effects.

The strict correlations and controls required in such prior art methods demand highly sophisticated equipment, highly skilled operators or both. While it is recognized, that in certain proton-enhanced diffusion operations, particularly where the movement of the junction or drive-in diffusion has to be within the very exacting dimensional limitations, the prior art techniques may be effective, it would be desirable, if possible, to reduce the need for sophisticated equipment or highly skilled operators where the proton-enhanced diffusion techniques are to be carried out on a large scale in an integrated circuit production line.

SUMMARY OF THE PRESENT INVENTION

Accordingly, it is a primary object of the present invention to provide a method of proton-enhanced diffusion requiring minimum correlation and control of the parameters involved in the method.

It is another object of the present invention to provide a method of proton-enhanced diffusion utilizable for simultaneously forming regions of the same conductivity characteristics having different junction depths in a semiconductor substrate.

It is a further object of the present invention to provide a method of integrated circuit fabrication wherein proton-enhanced diffusion is utilized in a simultaneous formation of base and junction isolation regions.

The present invention accomplishes the above objects by a method wherein the bombardment with the protons or other light ions is carried out in a separate step prior to the higher temperature drive-in diffusion step. This is accomplished by initially bombarding regions in a semiconductor substrate of a selected conductivity type with inert or non-dopant ions having a maximum atomic number of two. This bombardment which creates the vacancies in the crystal lattice structure of the semiconductor substrate may be carried out at any time prior to the drive-in step, i.e., the bombardment may be carried out prior to, subsequent to or even simultaneously with the formation of regions of the selected conductivity type in the semiconductor substrate. The regions which are subjected to this bombardment may be formed by either conventional diffusion or ion implantation of the selected conductivity-determining or dopant ions.

It is critical to the method of the present invention that there is no annealing as well as no diffusion of dopant ion during the bombardment step. Accordingly, the bombardment step must be carried out at a temperature below 300°C, and most conveniently at room temperature. In this manner, all of the substitutional vacancies created by the ion bombardment step remain unannealed and are present when the subsequent drive-in diffusion step is commenced. This subsequent drive-in diffusion step is carried out at a temperature sufficient to diffuse the dopant ion in the region subjected to the bombardment. The temperature will depend, of course, on the well-established diffusivity characteristics of the dopant ion but will be substantially below the diffusivity rate in unbombarded semiconductor substrates. The temperature of the subsequent drive-in diffusion step must be in the range of from 600° – 900° C.

The bombardment with the non-dopant ions is preferably carried out so as to introduce these non-dopant ions into the region adjacent to the selected regions containing the dopant ions so as to enhance the diffusion into such adjacent regions during the subsequent drive-in step. Where the drive-in is to be to a greater depth from the substrate surface, then, the dosage of the ion bombardment must be sufficient to introduce the non-dopant ions at a depth beyond the depth of the regions of dopant ions.

In any event, since all of the substitutional vacancies are present when the diffusion step is commenced, standard diffusion techniques may be utilized, and sophisticated equipment or the need for highly skilled operators may be avoided since the drive-in diffusion at the selected temperature between 600° and 900° C will continue until an equilibrium state is reached. At this point, the enhanced diffusion will cease irrespective of whether the heating is continued because once the extra vacancies produced by the non-dopant ion bombardment are filled further diffusion is negligible at the selected temperature in the range of 600° – 900° C. Any additional diffusion would require the conventional diffusion temperatures above 900° C.

In accordance with one aspect of the present invention, the two-step proton-enhanced diffusion technique described above may be very effectively utilized in the simultaneous fabrication of substrate regions of the same conductivity-type and doping levels having different junction depths with respect to a surface or interface. In thus forming the base and isolation regions in junction isolated planar transistor integrated circuits by a simultaneous fabrication process, an epitaxial layer of one conductivity-type is initially formed on a substrate of opposite conductivity-type. Then, dopant ions of said opposite conductivity-type are simultaneously introduced into the epitaxial surface regions selected for base and isolation regions in the particular integrated circuit configuration; the additional bombardment with the non-dopant ions is conducted with the base regions masked so that only the isolated regions are bombarded; the bombardment is conducted at temperatures below 300° C. The epitaxial layer is then heated at a temperature in the range of from 600° – 900° C for a period sufficient to drive-in diffuse the bombarded isolation regions through the epitaxial layer into contact with the substrate but insufficient to drive-in diffuse the unbombarded base regions at such a depth. In this manner, the P-N junction isolation is completed around the transistor device while the junctions of the unbombarded base regions remain substantially unchanged.

The foregoing and other objects, features and advantages of the invention will be apparent from the following more particular description of the preferred embodiment of the invention, as illustrated in the accompanying drawings.

DESCRIPTION OF THE PREFERRED EMBODIMENT

With reference to FIGS. 1 – 5, there will now be described a method utilizing the proton-enhanced diffusion process of the present invention in order to simultaneously fabricate the P-type base regions and the P-type isolation regions in a junction isolated bipolar transistor integrated circuit.

Figure 1:
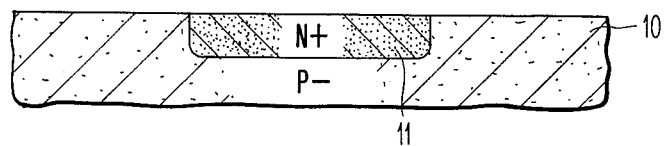
FIGS. 1 – 5 are diagrammatic partial sections of a portion of an integrated circuit at various fabrication stages indicated in the drawings as illustrative of the steps involved in the practice of a preferred embodiment of the present invention.

Referring to FIG. 1, a substrate 10 of P-type conductivity, preferably having a resistivity of about 10 to 20 ohms-cm and a thickness of about 15 mils has formed therein by conventional diffusion ion implantation techniques an N+ subcollector region 11 having a $C_0$ of $2 \times 10^{20}$ cm$^{-3}$. The sheet resistance of N+ region 11 is approximately 4 to 5 ohms/square.

Figure 2:
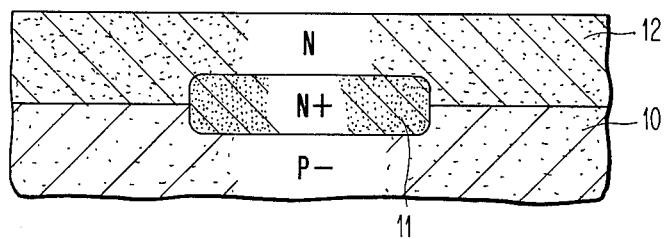

Next, FIG. 2, a region 12 of N-type conductivity preferably having a resistivity of 0.3 to 0.5 ohms/cm is epitaxially grown on the surface of substrate 10. The epitaxial region 11 is an arsenic doped layer in the order of 2 microns in thickness. During the epitaxial growth, N+ region 11 out-diffuses into epitaxial layer 12 as shown.

Figure 3:
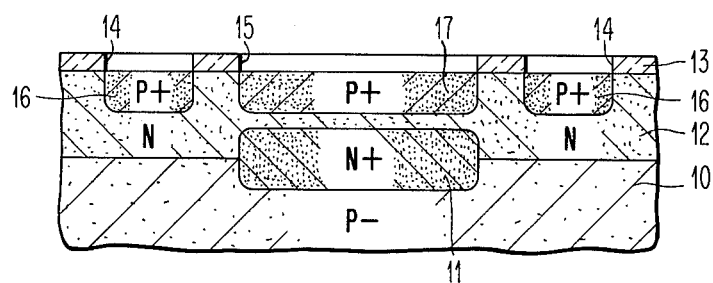

Next, as shown in FIG. 3, a silicon dioxide layer 13 approximately 1500 A thick is formed on the surface of the epitaxial layer by either conventional thermal oxidation, pyrolytic deposition or RF sputter deposition techniques. Then, utilizing conventional integrated circuit fabrication photolithographic etching techniques, apertures 14 are formed through silicon dioxide layer 13 coincident with the P-type isolation regions to be subsequently formed, and aperture 15 is formed to coincide with the subsequently to be formed P-type base region. Next, utilizing conventional integrated circuit diffusion techniques a P diffusion is carried out preferably using a boron source to form isolation regions 16 and base region 17 simultaneously. Regions 16 and 17 have a $C_0$ (surface concentration) of 2 to 3 × $10^{18}$ cm$^{-3}$. Alternatively, regions 16 and 17 may be formed by the simultaneous introduction or boron or other P type ions by standard ion implantation techniques.

At this point, it is to be noted that when reference is made to standard integrated circuit fabrication techniques as well as diffusion techniques, the methods described in U.S. Pat. No. 3,539,876 may be referred to as an example of such techniques, and when conventional ion implantation techniques or equipment are specified, U.S. Pat. No. 3,756,862 may be referred to for examples of such standard ion implantation techniques and equipment.

Figure 4:
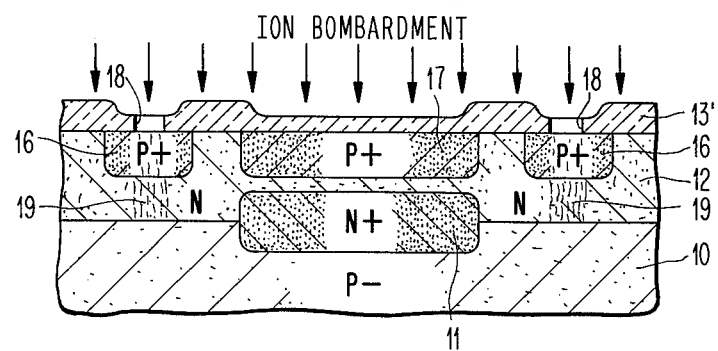

The structure which up to now has been formed by standard integrated circuit fabricated techniques will now be subjected to the method of the present invention in order to secure the benefits of proton-enhanced diffusion with respect to isolation region 16. Referring now to FIG. 4, silicon dioxide surface layer 13' is reformed so as to be thick enough to act as an effective ion implant mask and cover the entire surface of epitaxial layer 12. This may be conveniently accomplished by either conventional pyrolytic deposition or sputter deposition techniques since these require temperatures well below the diffusion temperatures for any of the regions formed in the substrates. Then, once again utilizing conventional integrated circuit fabrication photolithographic techniques, openings 18 are formed in layer 13' coincident with isolation regions 16. Alternatively, a layer of other material such as photoresist may be formed over layer 13 and openings such as opening 18 defined in this layer.

Then, utilizing standard ion implantation equipment, for example of the type described in U.S. Pat. No. 3,756,862, the substrate is subjected to ion bombardment with non-dopant ions, i.e., a proton ($H_2^+$). The bombardment is conducted at an energy level in the range of 200 to 250 Kev, at room temperature where the epitaxial layer is 2 to 3 microns thick. The dosage of the proton is in the range of from $5 \times 10^{14}$ cm$^{-2}$ to $5 \times 10^{15}$ cm$^{-2}$. Under these conditions the optimum structural damage, and thus the maximum diffusion vacancies will be in region 19 having substantially the same lateral dimensions as openings 18 and below isolation regions 16.

Figure 5:
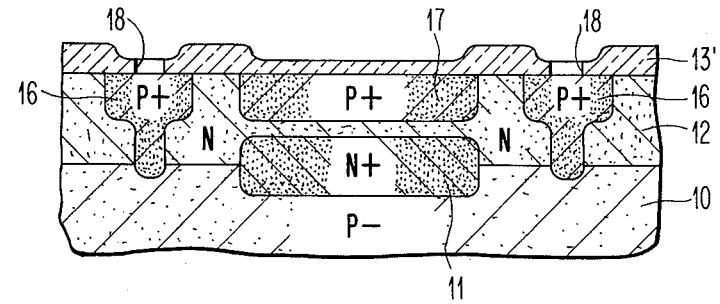

Next, FIG. 5, the structure is heated at a temperature of from 600° – 900° C, in the present case 700° C for 30 minutes. P isolation regions 16 are driven in until they extend completely through epitaxial layer 12 into contact with P substrate 10 to thereby complete the isolation around a transistor comprising base region 17. During this drive-in diffusion step, base region 17 which has been unbombarded does not undergo any drive-in diffusion.

The integrated circuit structure may then subsequently be completed by standard emitter formation techniques, the deposition of appropriate passivating layers and metallization patterns in accordance with conventional semiconductor fabrication processes.

While the preferred embodiment utilized to illustrate the practice of the invention involves proton-enhanced diffusion of regions extending from epitaxial layer surface, it will be understood that even buried regions, i.e., regions remote from the surface may be subjected to the proton-enhanced diffusion techniques of the present invention in order to selectively diffuse such buried regions into immediately adjacent regions above, below, or lateral to the buried regions. It should also be recognized that the present invention may, by the selective control of the region to be subjected to the maximum crystalline damage and thus the maximum number of diffusion vacancies, be utilized to effect drive-in or movement of regions by diffusion into areas immediately adjacent to such regions.

While the invention has been particularly shown and described with reference to the preferred embodiment thereof, it will be understood by those skilled in the art that various changes in form and details may be made therein within departing from the spirit and scope of the invention.

What is claimed is:

1. A method for forming regions of a selected conductivity-type in a semiconductor substrate comprising
   introducing dopant ions of said conductivity-type into selected regions of a surface of said substrate, and additionally bombarding at least portions of said regions with non-dopant ions having a maximum atomic number of 2,
   said bombardment being carried out at a temperature below 300° C, and
   heating said substrate at a temperature in the range of from 600° to 900° C sufficient to diffuse dopant ions from said regions further into said substrate and to anneal.

2. The method of claim 1 wherein said dopant ions are introduced by diffusion.

3. The method of claim 1 wherein said dopant ions are introduced by ion implantation.

4. The method of claim 2 wherein said diffusion of dopant ions precedes said bombardment.

5. The method of claim 3 wherein said ion implantation of dopant ions precedes said bombardment.

6. The method of claim 1 wherein said non-dopant ions are protons.

7. The method of claim 1 wherein said non-dopant ions are helium ions.

8. The method of claim 1 wherein said semiconductor substrate is silicon.

9. The method of claim 1 wherein said bombardment with non-dopant ions is carried out at an energy sufficient to introduce the non-dopant ions at a depth from said surface beyond the depth of said regions of dopant ions.

10. A method for forming regions of a selected conductivity in a semiconductor substrate comprising
    introducing dopant ions into selected regions of said substrate, and additionally bombarding at least portions of said regions with non-dopant ions having a maximum atomic number of 2,
    said bombardment being carried out at a temperature below 300° C, and
    heating said substrate at a temperature in the range of from 600° to 900° C sufficient to diffuse dopant ions from said regions further into said substrate and to anneal.

11. The method of claim 10 wherein said bombardment with non-dopant ions is carried out at an energy sufficient to introduce the non-dopant ions into substrate regions adjacent to said selected conductivity regions.

12. A method for forming regions of a selected conductivity-type extending to different depths in a semiconductor substrate comprising
    simultaneously introducing dopant ions of said conductivity-type into a plurality of regions of a surface of said substrate, and
    additionally bombarding at a temperature below 300° C at least portions of each of the regions in a first set of said conductivity-type regions with non-dopant ions having a maximum atomic number of 2 while permitting a second set of said regions to remain unbombarded, and
    heating said substrate at a temperature in the range of from 600° to 900° C sufficient to selectively drive-in diffuse said bombarded regions to a greater depth from said surface than said unbombarded regions.

13. The method of claim 12 wherein said bombardment with non-dopant ions is carried out at an energy sufficient to introduce the non-dopant ions at a depth from said surface beyond the depth of said regions of dopant ions.

14. The method of claim 13 wherein said dopant ions are introduced by diffusion.

15. The method of claim 13 wherein said dopant ions are introduced by ion implantation.

16. The method of claim 14 wherein said diffusion of dopant ions precedes said bombardment.

17. The method of claim 15 wherein said ion implantation of dopant ions precedes said bombardment.

18. The method of claim 13 wherein said non-dopant ions are protons.

19. The method of claim 13 wherein said non-dopant ions are helium ions.

20. The method of claim 13 wherein said semiconductor substrate is silicon.

21. A method for simultaneously forming the base and isolation regions in junction isolated planar transistor integrated circuits comprising
    forming an epitaxial layer of one conductivity-type on a semiconductor substrate of opposite conductivity-type,
    simultaneously introducing dopant ions of said opposite conductivity-type into the epitaxial surface regions selected for said base and isolation regions, and
    additionally bombarding at a temperature below 300° C at least portions of said isolation regions with non-dopant ions having a maximum atomic number of 2 while permitting said base regions to remain unbombarded,
    and heating said epitaxial layer at temperatures in the range of from 600° to 900° C for a period sufficient to drive-in diffuse said bombarded isolation regions through the epitaxial layer into contact with said substrate but insufficient to drive-in the unbombarded base regions to such a depth.

22. The method of claim 21 wherein said dopant ions are introduced by diffusion.

23. The method of claim 21 wherein said dopant ions are introduced by ion implantation.

24. The method of claim 22 wherein said diffusion of dopant ions precedes said bombardment.

25. The method of claim 23 wherein said ion implantation of dopant ions precedes said bombardment.

26. The method of claim 21 wherein said non-dopant ions are protons.

27. The method of claim 21 wherein said non-dopant ions are helium ions.

28. The method of claim 21 wherein said semiconductor substrate is silicon.

29. The method of claim 28 wherein said opposite conductivity-type is P-type.

* * * * *